United States Patent
Wan Fong et al.

(10) Patent No.: US 10,123,397 B2
(45) Date of Patent: Nov. 6, 2018

(54) TRACKING AND COMMISSIONING OF LIGHT ENGINES USING NEAR FIELD COMMUNICATION

(71) Applicant: GENERAL ELECTRIC COMPANY, Schenectady, NY (US)

(72) Inventors: David Wan Fong, Montreal (CA); Eric Lavigne, Montreal (CA); Yaseen Ahmed Waheed, Montreal (CA)

(73) Assignee: General Electric Company, Schenectday, NY (US)

( * ) Notice: Subject to any disclaimer, the term of this patent is extended or adjusted under 35 U.S.C. 154(b) by 0 days.

(21) Appl. No.: 15/423,906

(22) Filed: Feb. 3, 2017

(65) Prior Publication Data
US 2018/0077780 A1 Mar. 15, 2018

Related U.S. Application Data

(60) Provisional application No. 62/393,618, filed on Sep. 12, 2016.

(51) Int. Cl.
| H05B 37/02 | (2006.01) |
| H05B 33/08 | (2006.01) |
| G11C 16/30 | (2006.01) |

(52) U.S. Cl.
CPC ......... H05B 37/0272 (2013.01); G11C 16/30 (2013.01); H05B 33/0842 (2013.01)

(58) Field of Classification Search
CPC ............ H05B 37/0272; H05B 33/0842; G11C 16/30; G01R 31/44
USPC .......................................................... 315/294
See application file for complete search history.

(56) References Cited

U.S. PATENT DOCUMENTS

| 8,381,981 | B2 | 2/2013 | Fowler et al. | |
| 9,548,797 | B1* | 1/2017 | Green | H04B 5/0031 |
| 9,693,431 | B1* | 6/2017 | Leshniak | H05B 37/0272 |
| 9,854,651 | B2* | 12/2017 | Lai | H05B 37/0272 |
| 2005/0269480 | A1* | 12/2005 | Ford | F21L 4/02 |
| | | | | 250/200 |
| 2007/0121323 | A1 | 5/2007 | Pawlik et al. | |
| 2008/0272586 | A1 | 11/2008 | Hick et al. | |
| 2013/0026947 | A1* | 1/2013 | Economy | H05B 37/0272 |
| | | | | 315/287 |
| 2014/0117859 | A1* | 5/2014 | Swatsky | H05B 37/0272 |
| | | | | 315/158 |
| 2015/0061541 | A1* | 3/2015 | Gandini | H05B 37/0272 |
| | | | | 315/294 |
| 2015/0120246 | A1 | 4/2015 | Shrubsole et al. | |
| 2015/0342011 | A1* | 11/2015 | Brochu | G05B 19/124 |
| | | | | 315/294 |

(Continued)

OTHER PUBLICATIONS

Hitachi EEPROM data sheet (Two wire serial interface), ADE-203-882B, Jan. 25, 1999. p. 1.*

Primary Examiner — Dylan White
(74) Attorney, Agent, or Firm — Peter T. Dimauro; GE Global Patent Operation

(57) ABSTRACT

Provided is a light emitting diode (LED) lighting fixture including a light engine, a plurality of LEDs, an LED driver, and a near field communication (NFC) electrically erasable programmable read only memory (EEPROM) circuit. The NFC EEPROM circuit provides an avenue for storing information pertaining to the LED light fixture that is easily accessible.

11 Claims, 4 Drawing Sheets

(56) References Cited

U.S. PATENT DOCUMENTS

| | | | |
|---|---|---|---|
| 2016/0056629 A1* | 2/2016 | Baker | G05B 15/02 |
| | | | 700/276 |
| 2016/0128158 A1* | 5/2016 | Harder | H05B 33/0872 |
| | | | 315/158 |
| 2016/0183344 A1* | 6/2016 | Chitta | G05B 19/102 |
| | | | 315/294 |
| 2016/0309570 A1* | 10/2016 | Han | H05B 33/0815 |
| 2016/0316536 A1* | 10/2016 | Oepts | H05B 33/0851 |
| 2016/0323981 A1* | 11/2016 | Clark | F21V 15/01 |

* cited by examiner

TRACKING AND COMMISSIONING OF LIGHT ENGINES USING NEAR FIELD COMMUNICATION

CROSS-REFERENCE

The present invention is a non-provisional application claiming priority to provisional application No. 62/393,618 filed on Sep. 12, 2016, incorporated by reference herein in its entirety.

TECHNICAL FIELD

The present invention generally relates to storing data on a light emitting diode (LED) light engine. More particularly, the present invention relates to tracking and commissioning LED light engine parameters utilizing an electrically erasable programmable read-only memory (EEPROM).

BACKGROUND

Conventional LED light engines are programmable and require a variety of parameter settings (e.g., drive current etc.) for the related LED drivers. However, to be optimized for maximum utility, different LED light engines require different settings. Accordingly, unique operational settings, and other information relevant to operation of the LED light engine, must be catalogued, tracked, and made readily available.

During manufacture and deployment of LED light engines, tracking and monitoring inventory can be particularly challenging given the unique nature of each light engine. Additionally, the LED semiconductor dies may also have different characteristics and operational settings, such as part number, voltage binning, and color binning etc.

When considering LED operation at the light engine level, a variety of other characteristics become relevant. By way of example, these other characteristics can include the current level for which the light engine is designed, the expected luminous flux, and the number of serial LEDs. A few other characteristics include the number of LEDs in parallel, and the type of fixture into which the light engine will ultimately be affixed, heat sinking requirements, etc. This wide variety of characteristics highlights the challenges of tracking and matching different types of LEDs. These challenges are also highlighted through use of different light engines, and their respective optimal settings. This ultimately complicates the process of programming individual light engines for optimal performance.

Conventional solutions to these challenges include using stickers with barcodes. However, these solutions are inefficient and consume too much of the physical space on the light engine. Additionally, multiple barcodes are typically required for the volume of data stored on LED Light engines. The requirement of multiple barcodes further complicates the physical space limitation and requires time to read. More fundamentally, these stickers can be easily lost or damaged.

SUMMARY OF THE INVENTION

Given the aforementioned deficiencies, a need exists for a method and/or device that stores the LED light engine parameters on the light engine and requires minimal space.

In exemplary embodiments of the present invention, information can be transmitted associated with LED drive current and other relevant parameters, from the light engine to the LED driver. For example, data associated with the light engine can be stored to support manufacture and production of fixtures while programming the drive current of the drivers. This data can be transferred via near-field communication (NFC) and stored in a memory device, such as an EEPROM. Storing the data remedies the manufacture and production difficulties. Additionally, the information can be accessed at a later time via the EEPROM.

Embodiments of the present invention offer a number of technical advantages, including the ability to store information locally, directly on the light engine. This local information storage, via NFC EEPROMs, eliminates the use of database entry points, such as barcode scanners—thus simplifying data management.

Another advantage is a reduction in the physical space required on the light engine. That is, use of an NFC EEPROM requires less space than barcode solutions. A further advantage is NFC EEPROMs require less circuitry than the conventional approaches.

Additional features, modes of operations, advantages, and other aspects of various embodiments are described below with reference to the accompanying drawings. It is noted that the present disclosure is not limited to the specific embodiments described herein. These embodiments are presented for illustrative purposes only. Additional embodiments, or modifications of the embodiments disclosed, will be readily apparent to persons skilled in the relevant art(s) based on the teachings provided.

BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are only for purposes of illustrating the embodiments and are not to be construed as limiting the disclosure. Given the following enabling description of the drawings, the novel aspects of the present disclosure should become evident to a person of ordinary skill in the relevant art(s).

DETAILED DESCRIPTION OF THE EMBODIMENTS

While the present invention is described herein with illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

Alternative embodiments, examples, and modifications which would still be encompassed by the disclosure may be made by those skilled in the art, particularly in light of the foregoing teachings. Further, it should be understood that the terminology used to describe the disclosure is intended to be in the nature of words of description rather than of limitation.

Figure 1:
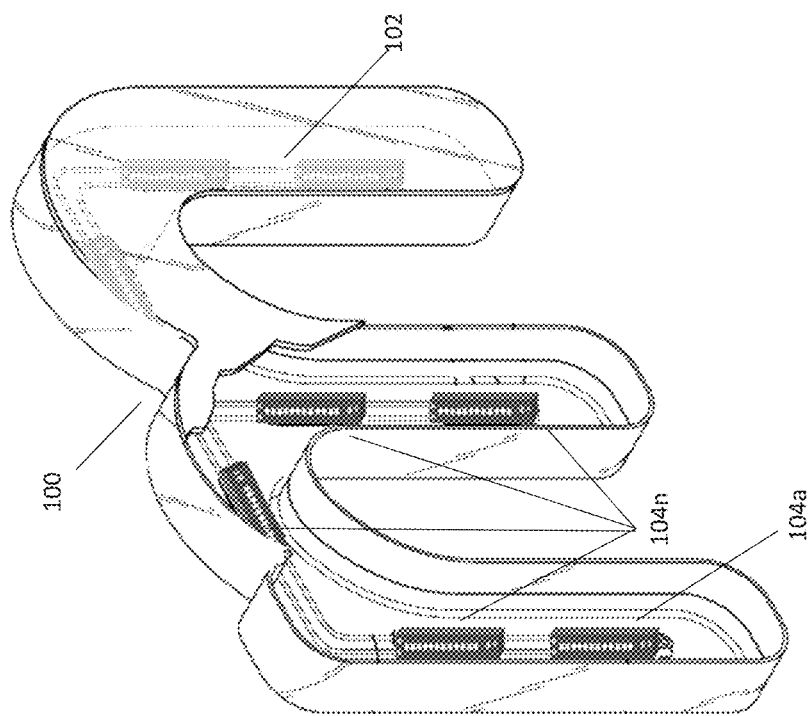
FIG. 1 is an illustration of a backlit sign constructed in accordance with embodiments of the present invention.

FIG. 1 is an illustration of a backlit sign 100 constructed in accordance with an embodiment of the present invention. The backlit sign 100 includes a lighting module 102 for providing illumination within the backlit sign 100. The lighting module 102 includes a number of light fixtures 104a-104n, each including a plurality of LEDs. The light fixtures 104a-104b are discussed in greater detail below.

Figure 2:
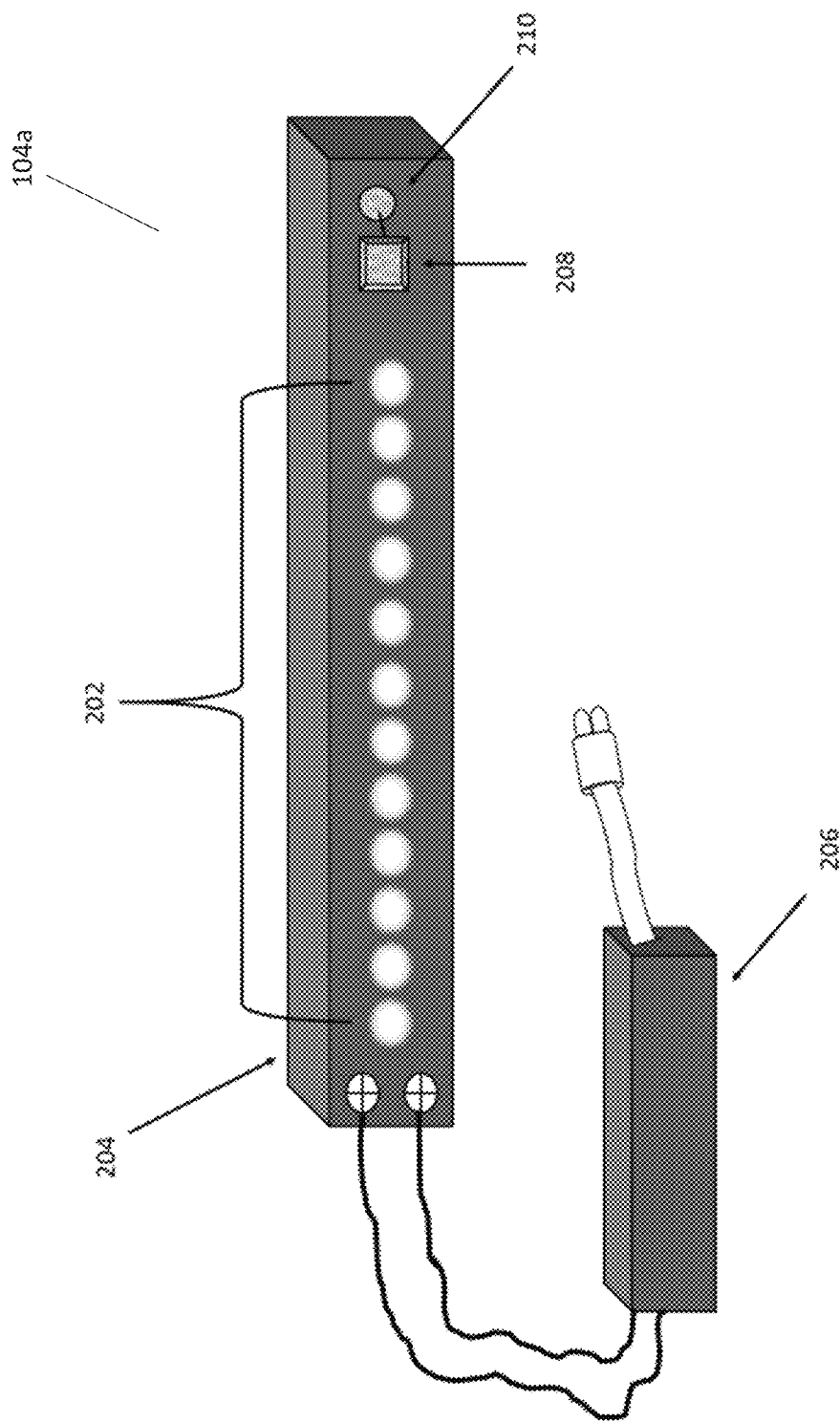
FIG. 2 is an illustration of one of the LED light engines shown in FIG. 1 in accordance with the embodiments.

FIG. 2 illustrates one of the LED lighting fixtures 104a shown in FIG. 1 using an NFC EEPROM, in accordance with the embodiments. The LED lighting fixture 104a includes a plurality of LEDs 202, a light engine 204, one or more LED drivers 206, an NFC EEPROM 208, and an antenna 210. The number of LEDs 202 can vary. The NFC EEPROM 208 can be placed at numerous location on the LED lighting fixture 200.

By way of background, NFC is a set of communication protocols enabling two electronic devices to establish communication when placed in close proximity (e.g., within 5 cm or less) to each other. NFC creates electromagnetic induction between two loop antennas affixed to each of the devices. As understood in the art, NFC devices are configured to operate in three modes: NFC card emulation, NFC reader/writer, and NFC peer-to-peer. NFC tags are passive data stores which can be read, and written to, by an NFC device.

In the embodiments, the NFC EEPROM 208 is added to the light engine 204 to permit the light engine 204 to acquire and store information there within. Storage occurs without the need to connect any wire. As well understood in the art, an EEPROM is a type of non-volatile memory that allows individual bytes to be erased and/or reprogrammed. There are several types of EEPROMs including memory density, memory organization, nominal supply voltage, maximum clock frequency, maximum write cycle time, maximum access time and packaging type.

An NFC EEPROM may have a data capacity of from 4 Kb up to 64 Kb or higher, which is sufficient to store information related to characteristics of the LED light engine 204. An NFC enabled mobile communication device (e.g., smartphone) or other NFC-enabled device is generally needed to store data in the NFC EEPROM 208.

The EEPROM 208 on the light engine 204 is coupled to an antenna 210 capable of capturing or otherwise interacting with the electromagnetic field, as noted above. The electromagnetic field can power the EEPROM and can be used as a data transmission media.

Through use of the illustrious embodiments, various light engine parameters can be easily stored in the NFC EEPROM 208, thus reducing the need of physical space on the light engine 204. When all of the required information is stored in the NFC EEPROM 208, optimally programming the LED drivers 206 becomes trivial.

For example, a technician could query the EEPROM 208 of the light engine 204 regarding the level of output current required from the LED driver 206. Once determined, that level can be used to program the LED driver 206. An obvious commercial advantage to this approach, is that efficient replacement of light engines 204 is now possible.

Since the data is stored on the EEPROM 208, it can be erased after use if desired. Additionally, the data stored on the EEPROM 208 can be encrypted. Thus, using the NFC EEPROM 208 provides several advantages to merely writing the same or similar data on a printed circuit board (PCB). The latter approach creates a risk of exposing the data to unauthorized parties.

Figure 3:
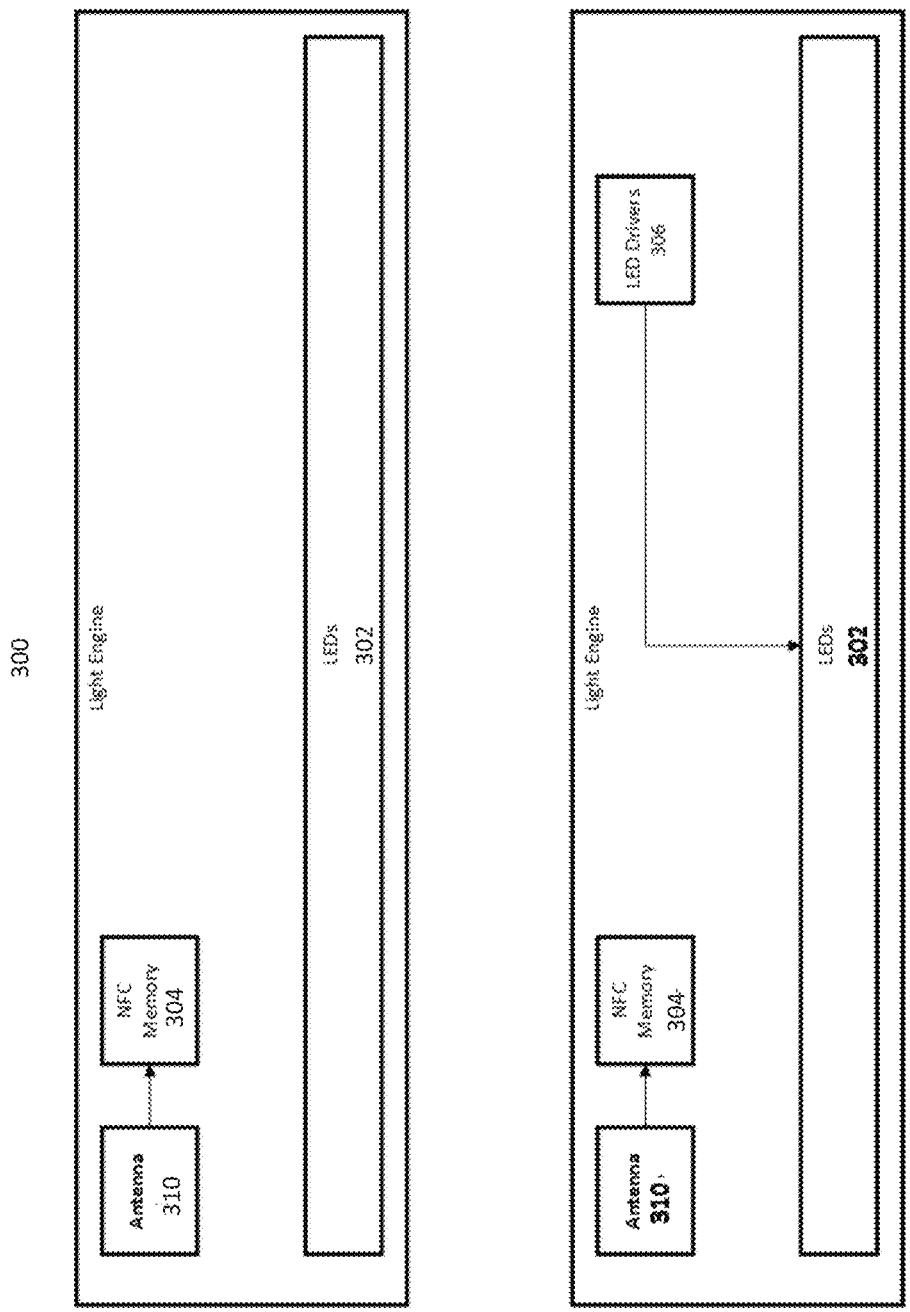
FIG. 3 is a block diagram of the LED light fixture depicted in FIG. 2.

FIG. 3 is a block diagram 300 of the LED light engine 204 depicted in FIG. 2. The antenna 310 is electrically coupled to a memory circuit 304. In the exemplary embodiments, the memory circuit 304 is an NFC EEPROM device. The LED Drivers 306 may be located on the light engine 204 or the LED Drivers 306 may be located external to the light engine 204.

Figure 4:
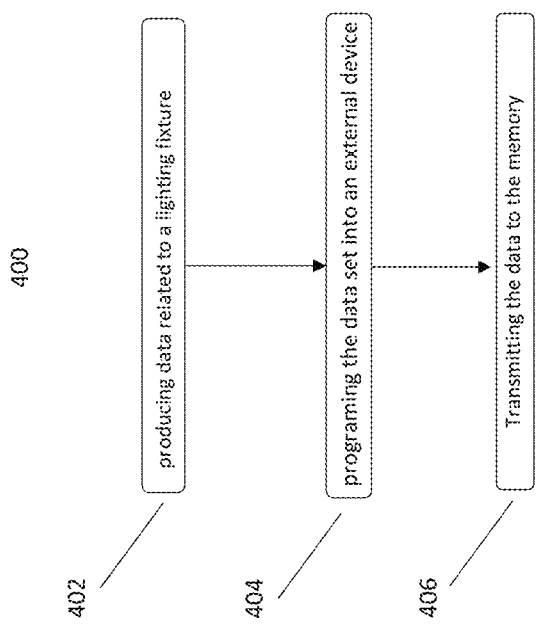
FIG. 4 is a flowchart of an exemplary method of practicing an embodiment of the present invention.

FIG. 4 is a flowchart of an exemplary method 400 of practicing an embodiment of the present invention. The method 400 stores data related to operation of a lighting system including a light engine with a plurality of LEDs controlled via a driver. The light system also includes a memory circuit electrically coupled to the light engine. The method 400 includes producing the data, as noted in block 402. The data is programmed onto an external NFC enabled device as noted in block 404. In block in 406, the data is transmitted to the memory circuit via the NFC enabled device.

Those skilled in the art will also appreciate that various adaptations and modifications of the preferred and alternative embodiments described above can be configured without departing from the scope and spirit of the disclosure. Therefore, it is to be understood that, within the scope of the appended claims, the disclosure may be practiced other than as specifically described herein.

What is claimed is:

1. A method for storing data related to operation of a lighting system including a light engine including a plurality of LEDs controlled via a driver, and a memory circuit coupled to the light engine, wherein the memory circuit comprises an electrically erasable programmable read-only memory (EEPROM) electrically coupled to an antenna for powering the EEPROM by an electromagnetic field, the method comprising:
   producing the data;
   programming the data into an external near-field communication (NFC) enabled device;
   transmitting the data to the memory circuit via the NFC enabled device;
   querying the memory circuit for the data; and
   programming an LED driver with the data, wherein the LED driver is located external to the light engine.

2. The method for storing according to claim 1, further comprising storing the data set on the EEPROM.

3. The method for storing according to claim 2, wherein the data set stored on the EEPROM being configured to provide parameters for programming the light engine.

4. The LED data storage method of claim 1, wherein the light engine acquires and stores the data wirelessly via the NFC enabled device.

5. The method for storing according to claim 1, wherein the data is regarding the level of output current required from the LED driver for the light engine.

6. A method for storing data related to operation of a lighting system comprising a memory circuit and a light engine including a plurality of LEDs controlled via a driver, wherein the memory circuit comprises an electrically erasable programmable read-only memory (EEPROM) electrically coupled to an antenna for powering the EEPROM by an electromagnetic field, the method comprising:
   producing the data;
   programming the data into an external near-field communication (NFC) enabled device;

transmitting the data to the memory circuit via the NFC enabled device;
querying the memory circuit for the data; and
programming an LED driver with the data, wherein the LED driver is located external to the light engine.

7. The method for storing according to claim 6, wherein the data is regarding the level of output current required from the LED driver for the light engine.

8. A method related to operation of a lighting system, the lighting system comprising a memory circuit and a light engine including a plurality of LEDs controlled via a driver, the method comprising:
querying the memory circuit for data, wherein the memory circuit comprises an electrically erasable programmable read-only memory (EEPROM) electrically coupled to an antenna for powering the EEPROM by an electromagnetic field; and
programming an LED driver with the data, wherein the LED driver is located external to the light engine.

9. The method according to claim 8, wherein the data is regarding the level of output current required from the LED driver for the light engine.

10. The method according to claim 8, further comprising a step of erasing the data after the step of programming the LED driver.

11. The method according to claim 8, wherein the data stored on the EEPROM is encrypted.

* * * * *